US012575193B2

(12) United States Patent
Yang et al.

(10) Patent No.: US 12,575,193 B2
(45) Date of Patent: Mar. 10, 2026

(54) HETEROJUNCTION CELL AND MANUFACTURING METHOD THEREOF, PHOTOVOLTAIC MODULE AND PHOTOVOLTAIC SYSTEM

(71) Applicant: TRINA SOLAR CO., LTD., Changzhou (CN)

(72) Inventors: Guangtao Yang, Changzhou (CN); Daming Chen, Changzhou (CN); Yifeng Chen, Changzhou (CN); Hongwei Li, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/754,372

(22) Filed: Jun. 26, 2024

(65) Prior Publication Data

US 2024/0347661 A1     Oct. 17, 2024

(30) Foreign Application Priority Data

Dec. 19, 2023    (CN) .......................... 202311746956.1

(51) Int. Cl.
*H10F 77/20*        (2025.01)
*H10F 10/16*        (2025.01)
*H10F 71/00*        (2025.01)

(52) U.S. Cl.
CPC ........... *H10F 10/16* (2025.01); *H10F 71/138* (2025.01); *H10F 77/211* (2025.01)

(58) Field of Classification Search
CPC ............. H01L 31/0747; H01L 31/0352; H01L 31/022433; H01L 31/0516; H01L 31/04;
(Continued)

(56) References Cited

U.S. PATENT DOCUMENTS

2010/0275964 A1 * 11/2010 Kinoshita ............. H10F 10/166
                                                          438/96
2013/0125953 A1 * 5/2013 Taira ............... H01L 31/022433
                                                          136/244
2015/0214398 A1 * 7/2015 Watahiki ............. H01L 31/1804
                                                          136/255

FOREIGN PATENT DOCUMENTS

CN          101908582 A     12/2010
CN          104377253 A  * 2/2015  ......... H01L 31/0224
(Continued)

OTHER PUBLICATIONS

English machine translation of Jin et al. (CN 104377253) published Feb. 25, 2015.*

(Continued)

*Primary Examiner* — Christina Chern
(74) *Attorney, Agent, or Firm* — MARSHALL, GERSTEIN & BORUN LLP

(57)          ABSTRACT

The present disclosure relates to a heterojunction cell and a manufacturing method thereof, a photovoltaic module and a photovoltaic system. The heterojunction cell includes: a substrate; a first intrinsic silicon layer, a first doped layer, and a first transparent conductive layer that are sequentially stacked on a first surface; and a second intrinsic silicon layer, a second doped layer, and a second transparent conductive layer that are sequentially stacked on a second surface. A doping type of the first doped layer is opposite to a doping type of the second doped layer. The first transparent conductive layer covers at least part of the first surface. The second transparent conductive layer covers the second surface and at least part of the plurality of lateral surfaces. An edge of the first transparent conductive layer is spaced apart from an edge of the second transparent conductive layer, to define an isolation region therebetween.

17 Claims, 10 Drawing Sheets

(58) Field of Classification Search
CPC .......... H01L 31/075; H01L 31/022425; H01L 31/022466; H10F 77/311; H10F 77/14; H10F 77/211; H10F 77/244
See application file for complete search history.

(56) References Cited

FOREIGN PATENT DOCUMENTS

| | | | |
|---|---|---|---|
| CN | 105684165 | A | 6/2016 |
| CN | 105810770 | A | 7/2016 |
| CN | 105990462 | A | 10/2016 |
| CN | 106784041 | A | 5/2017 |
| CN | 110400854 | A | 11/2019 |
| CN | 212648258 | U | 3/2021 |
| CN | 215815908 | U | 2/2022 |
| CN | 114171622 | A | 3/2022 |
| CN | 114171633 | A | 3/2022 |
| CN | 115799350 | A | 3/2023 |
| CN | 116487447 | A | 7/2023 |
| CN | 220121855 | U | 12/2023 |
| EP | 3136451 | A1 | 3/2017 |
| JP | 2009088203 | A | 4/2009 |
| JP | 2011060971 | A | 3/2011 |
| JP | 2015126171 | A | 7/2015 |
| JP | 2017130664 | A | 7/2017 |
| WO | WO-2012/059878 | A1 | 5/2012 |
| WO | WO-2015/064634 | A1 | 5/2015 |
| WO | WO-2016/207539 | A1 | 12/2016 |

OTHER PUBLICATIONS

English machine translation of Yoshikawa et al. (JP 2011-060971) published Mar. 24, 2011.*

First Office Action, Chinese Patent Application No. 202311746956.1, dated Jan. 26, 2024.

Examination Report, Australian Patent Application No. 2024202906, dated May 23, 2024.

Decision of Grant, Chinese Patent Application No. 202311746956.1, dated Mar. 19, 2024.

Japanese Office Action, Japanese Patent Application No. 2024-106338, dated Jul. 25, 2024.

European Search Report, European Patent Application No. 24184053.7, dated Jan. 17, 2025.

* cited by examiner

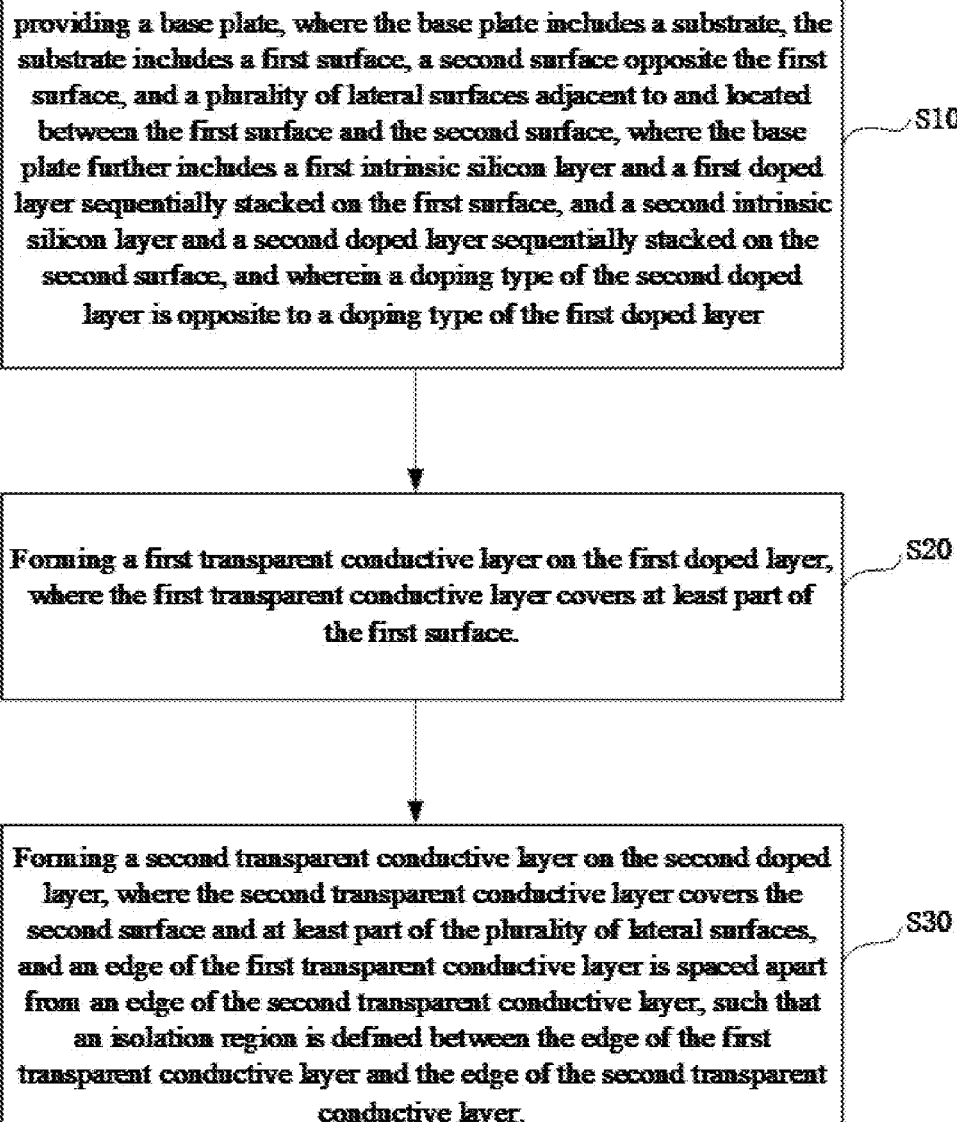

providing a base plate, where the base plate includes a substrate, the substrate includes a first surface, a second surface opposite the first surface, and a plurality of lateral surfaces adjacent to and located between the first surface and the second surface, where the base plate further includes a first intrinsic silicon layer and a first doped layer sequentially stacked on the first surface, and a second intrinsic silicon layer and a second doped layer sequentially stacked on the second surface, and wherein a doping type of the second doped layer is opposite to a doping type of the first doped layer ⌐S10

Forming a first transparent conductive layer on the first doped layer, where the first transparent conductive layer covers at least part of the first surface. ⌐S20

Forming a second transparent conductive layer on the second doped layer, where the second transparent conductive layer covers the second surface and at least part of the plurality of lateral surfaces, and an edge of the first transparent conductive layer is spaced apart from an edge of the second transparent conductive layer, such that an isolation region is defined between the edge of the first transparent conductive layer and the edge of the second transparent conductive layer. ⌐S30

FIG. 13

HETEROJUNCTION CELL AND MANUFACTURING METHOD THEREOF, PHOTOVOLTAIC MODULE AND PHOTOVOLTAIC SYSTEM

CROSS-REFERENCE TO RELATED APPLICATIONS

This application claims priority to Chinese patent application No. 202311746956.1, filed on Dec. 19, 2023, the content of which is hereby incorporated by reference in its entirety.

TECHNICAL FIELD

The present disclosure relates to the technical field of solar cells, and in particular to a heterojunction cell and a manufacturing method thereof, a photovoltaic module, and a photovoltaic system.

BACKGROUND

In recent years, with the rapid development of the photovoltaic industry, domestic and foreign markets have put forward increasingly higher requirements for the conversion efficiency and product performance of solar cells and photovoltaic modules. This has also prompted industry manufacturers to actively research and develop new cells, module structures and related processes. Heterojunction (HJT) cells have the advantages of low light attenuation, low temperature coefficient and etc., they can reduce energy consumption while reducing thermal damage to silicon substrates, and thus have become an important direction for the development of high-efficiency cells in the future. In the related art, the HJT cell is formed mainly by depositing intrinsic amorphous silicon films and then depositing P-type amorphous or microcrystalline silicon films and N-type amorphous or microcrystalline silicon films respectively on both sides of the silicon substrate to form HJTs, and then preparing respective transparent conductive oxide (TCO) layers on surfaces of the amorphous or microcrystalline silicon films on the both sides of the silicon substrate, then performing screen printing with a low-temperature silver paste and solidifying to form surface metal electrodes. However, the heterojunction cells in the related art have a problem of low efficiency.

SUMMARY

Based on the forgoing, it is necessary to provide a heterojunction cell and a manufacturing method thereof, a photovoltaic module and a photovoltaic system, to improve the efficiency of the heterojunction cell.

A first aspect of embodiments of the present disclosure provides a heterojunction cell. The heterojunction cell includes: a substrate including a first surface, a second surface opposite the first surface and a plurality of lateral surfaces adjacent to and located between the first surface and the second surface; a first intrinsic silicon layer, a first doped layer, and a first transparent conductive layer that are sequentially stacked on the first surface; and a second intrinsic silicon layer, a second doped layer, and a second transparent conductive layer that are sequentially stacked on the second surface, and wherein a doping type of the first doped layer is opposite to a doping type of the second doped layer are opposite. The first transparent conductive layer covers at least part of the first surface, and the second transparent conductive layer covers the second surface and at least part of the plurality of lateral surfaces. An edge of the first transparent conductive layer is spaced apart from an edge of the second transparent conductive layer, such that an isolation region is defined between the edge of the first transparent conductive layer and the edge of the second transparent conductive layer.

In an embodiment, the edge of the second transparent conductive layer is located at the lateral surfaces.

In an embodiment, the edge of the first transparent conductive layer is located at an inner side of an outer boundary of the first surface. A minimum distance D1 between the edge of the first transparent conductive layer and the boundary of the first surface is 100 μm.

In an embodiment, a maximum distance D2 between the edge of the second transparent conductive layer and the first surface is 100 μm.

In an embodiment, the second transparent conductive layer completely covers each of the lateral surfaces, and the second transparent conductive layer further covers part of the first surface. The edge of the second transparent conductive layer is located at an outer side of the edge of the first transparent conductive layer.

In an embodiment, a minimum distance D3 between the edge of the first transparent conductive layer and the edge of the second transparent conductive layer is 50 μm.

In an embodiment, a maximum distance D4 between the edge of the second transparent conductive layer and the boundary of the first surface is 1000 μm.

In an embodiment, the first doped layer covers the first surface and at least part of the plurality of lateral surfaces; and the edge of the second transparent conductive layer is stacked onto a side of the first doped layer that is away from the substrate.

In an embodiment, the heterojunction cell further includes an insulating isolation layer stacked at the isolation region and covers at least the isolation region.

In an embodiment, the insulating isolation layer completely coves the first doped layer, such that the insulating isolation layer covers the isolation region, and that at least part of the insulating isolation layer is isolated between the first doped layer and the second transparent conductive layer.

In an embodiment, a thickness of the insulating isolation layer is greater than or equal to 1.8 nm.

In an embodiment, the second intrinsic silicon layer and the second doped layer both cover the second surface and at least part of the plurality of lateral surfaces. The first intrinsic silicon layer covers the first surface and at least part of the plurality of lateral surfaces. Part of the second intrinsic silicon layer is stacked onto a side of the first intrinsic silicon layer that is away from the substrate. Part of the second doped layer is stacked onto the side of the first intrinsic silicon layer that is away from the substrate. Part of the first doped layer is stacked onto a side of the second doped layer that is away from the substrate.

In an embodiment, the insulating isolation layer covers the isolation region; and an edge of the insulating isolation layer is adjacent to the edge of the first transparent conductive layer and the edge of the second transparent conductive layer respectively.

In an embodiment, the insulating isolation layer is made of a material comprising SiOx. The insulating isolation layer is further doped with carbon element and nitrogen element, and/or, the insulating isolation layer is further doped with a first doping element, and the first doping element is the same as a doping element in the first doped layer.

In an embodiment, the first doped layer covers the first surface; and the edge of the second transparent conductive layer is located on each of the lateral surfaces of the substrate.

In an embodiment, a layer thickness of a first region of the first transparent conductive layer adjacent to the edge thereof gradually decreases in a first direction. The first direction is from a center of the first transparent conductive layer towards the edge of the first transparent conductive layer and is parallel to the first surface.

In an embodiment, a minimum width D5 of the first region in the first direction is 100 μm.

In an embodiment, the heterojunction cell further includes a first electrode and a second electrode. The first electrode is arranged on the first transparent conductive layer, and the second electrode is arranged on the second transparent conductive layer. A projection of the first electrode on a first plane and a projection of the second electrode on the first plane are staggered from each other, and the first plane is perpendicular to a thickness direction of the substrate.

In an embodiment, at least one of the first transparent conductive layer and the second transparent conductive layer includes one or more silver nanowire layers, and at least two transparent conductive film layers stacked on each other. The at least two transparent conductive film layers are made of different materials. At least two of the transparent conductive film layers is sandwiched with one of the silver nanowire layers.

In an embodiment, the heterojunction cell further includes one or more dielectric layers. At least one of the dielectric layers is arranged on a surface of the first transparent conductive layer that is away from the substrate, and/or, at least one of the dielectric layers is arranged on a surface of the second transparent conductive layer that is away from the substrate.

In an embodiment, at least one of the first transparent conductive layer and the second transparent conductive layer includes a transparent conductive film layer and a silver nanowire layer arranged on a surface of the transparent conductive film layer that facing the substrate.

A second aspect of the embodiments of the present disclosure provides a manufacturing method of a heterojunction cell. The manufacturing method includes: providing a base plate, where the base plate includes a substrate, the substrate includes a first surface, a second surface opposite the first surface, and a plurality of lateral surfaces adjacent to and located between the first surface and the second surface, where the base plate further includes a first intrinsic silicon layer and a first doped layer sequentially stacked on the first surface, and a second intrinsic silicon layer and a second doped layer sequentially stacked on the second surface, and wherein a doping type of the second doped layer is opposite to a doping type of the first doped layer; forming a first transparent conductive layer on the first doped layer, where the first transparent conductive layer covers at least part of the first surface; and forming a second transparent conductive layer on the second doped layer, where the second transparent conductive layer covers the second surface and at least part of the plurality of lateral surfaces, and an edge of the first transparent conductive layer is spaced apart from an edge of the second transparent conductive layer, such that an isolation region is defined between the edge of the first transparent conductive layer and the edge of the second transparent conductive layer.

In an embodiment, the forming the first transparent conductive layer on the first doped layer and the forming the second transparent conductive layer on the second doped layer include: forming the first transparent conductive layer on the first doped layer, forming the second transparent conductive layer on the second doped layer, and forming an insulating isolation layer on the isolation region, where the insulating isolation layer covers at least the isolation region.

In an embodiment, the forming the first transparent conductive layer on the first doped layer, the forming the second transparent conductive layer on the second doped layer, and the forming the insulating isolation layer at the isolation region include: placing a carrier plate having a hollow in a middle into a reaction chamber; placing the base plate on the carrier plate such that the first doped layer faces the carrier plate, and that a second region of the first doped layer is exposed to outside through the hollow, where the first doped layer further includes a third region, the third region is a portion other than the second region, of a surface of the first doped layer that is away from the substrate; forming the first transparent conductive layer in the second region of the first doped layer, while forming the insulating isolation layer in the third region; and forming the second transparent conductive layer on the second doped layer.

In an embodiment, in the forming the first transparent conductive layer in the second region of the first doped layer and the forming the insulating isolation layer in the third region, a water vapor pressure in the reaction chamber is in a range of $3e^{-3}$ Pa to $9.5e^{-3}$ Pa.

In an embodiment, the providing the base plate includes: forming the first intrinsic silicon layer on the first surface of the substrate, where the first intrinsic silicon layer covers the first surface and at least part of the plurality of lateral surfaces; forming the second intrinsic silicon layer on the second surface of the substrate, where the second intrinsic silicon layer covers the second surface and at least part of the plurality of lateral surfaces, and part of the second intrinsic silicon layer is stacked onto a side of the first intrinsic silicon layer that is away from the substrate; forming the second doped layer on a surface of the second intrinsic silicon layer away from the substrate, where the second doped layer covers the second surface and at least part of the plurality of lateral surfaces, and part of the second doped layer is stacked onto the side of the first intrinsic silicon layer that is away from the substrate; and forming the first doped layer on a surface of the first intrinsic silicon layer that is away from the substrate, where the first doped layer covers the first surface and at least part of the plurality of lateral surfaces, and part of the first doped layer is stacked onto a side of the second doped layer that is away from the substrate.

In an embodiment, the manufacturing method further includes, after forming the second transparent conductive layer on the second doped layer, forming a first electrode on the first transparent conductive layer; forming a second electrode on the second transparent conductive layer, where a projection of the first electrode on a first plane and a projection of the second electrode on the first plane are staggered from each other, and the first plane is perpendicular to a thickness direction of the substrate.

A third aspect of the embodiments of the present disclosure provides a photovoltaic module. The photovoltaic module includes at least one cell string. Each cell string includes at least two heterojunction cells as described above.

A fourth aspect of the embodiments of the present disclosure provides a photovoltaic system. The photovoltaic system includes the photovoltaic module as described above.

The above heterojunction cell and the manufacturing method thereof, a photovoltaic module and a photovoltaic system can achieve beneficial effect as follows.

The edge of the first transparent conductive layer and the edge of the second transparent conductive layer are spaced apart, so as to define the isolation region between the edge of the first transparent conductive layer and the edge of the second transparent conductive layer. As such, the first transparent conductive layer and the second transparent conductive layer can be effectively isolated from each other, contact and thus short circuit between the first transparent conductive layer and the second transparent conductive layer can be avoided, thereby reducing efficiency loss. In addition, the second transparent conductive layer covering at least part of the lateral surfaces can ensure high current density and minimize the loss of fill factor, thereby further improving the efficiency of the heterojunction cell.

BRIEF DESCRIPTION OF THE DRAWINGS

In order to illustrate embodiments of the present disclosure more clearly, the drawings used in the embodiments will be described briefly. Apparently, the following described drawings are merely for the embodiments of the present disclosure, and other drawings can be derived by those of ordinary skill in the art without any creative effort.

FIG. 13 is a schematic flowchart of a manufacturing method of a heterojunction cell according to the embodiment of the present disclosure.

Illustration for reference numerals:

Figure 1:
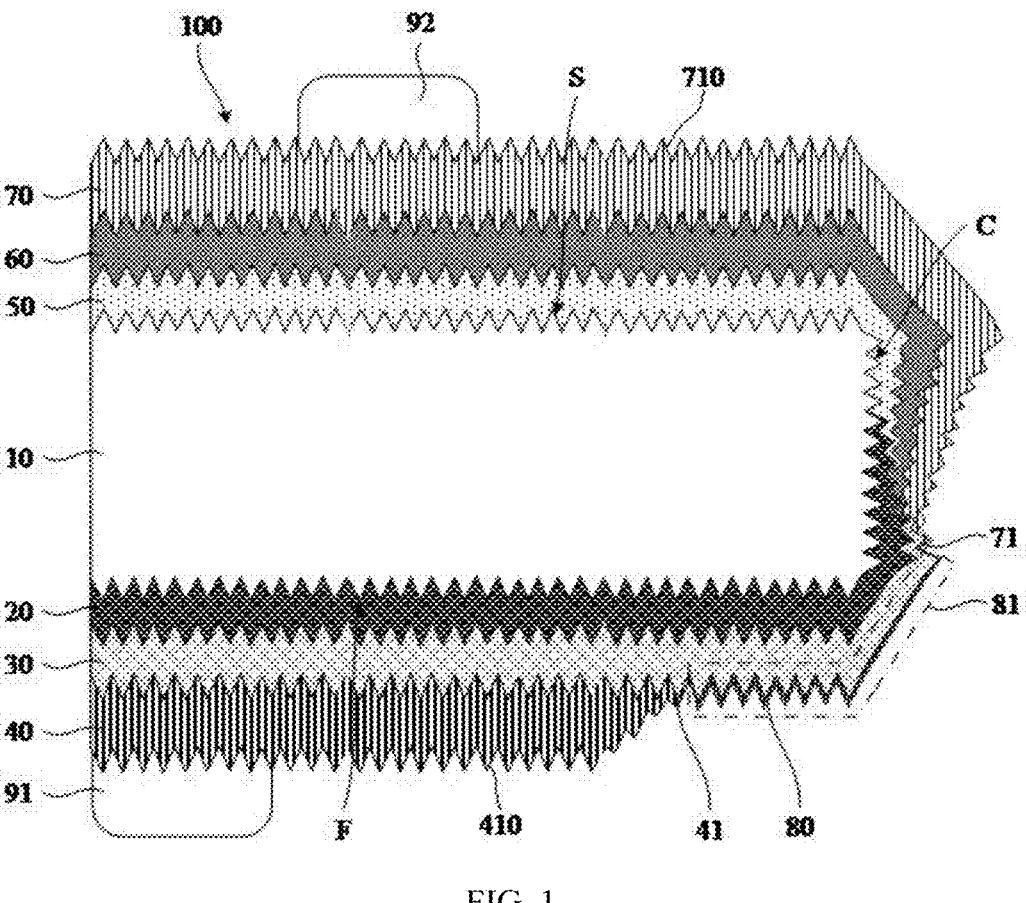
FIG. 1 is a schematic view of a heterojunction cell according to an embodiment of the present disclosure.

100. Heterojunction cell; 110. Base plate;

10. Substrate; 20. First intrinsic silicon layer; 30. First doped layer; 40. First transparent conductive layer; 41. Edge of the first transparent conductive layer;

50. Second intrinsic silicon layer; 60. Second doped layer; 70. Second transparent conductive layer;

71. Edge of the second transparent conductive layer; 780. Insulating isolation layer; 81. Isolation region; 91. First electrode; 92. Second electrode;

120. Carrier plate; 121. Hollow;

F. First surface; S. Second surface; C. Lateral surface; Z1. First region; Y. First direction.

DETAILED DESCRIPTION

In order to make the above objects, features and advantages of the present disclosure more obvious and easy to understand, the specific embodiments of the present disclosure will be described in detail below with reference to the accompanying drawings. In the following description, numerous specific details are set forth in order to provide a thorough understanding of the present disclosure. However, the present disclosure can be implemented in many other ways different from those described herein. Those skilled in the art can make similar improvements without departing from the connotation of the present disclosure. Therefore, the present disclosure is not limited to the specific embodiments disclosed below.

In the description of the present disclosure, it should be understood that orientations or positional relationships indicated by terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential" and etc. are based on the orientations or positional relationships shown in the drawings, only for the convenience of describing the present disclosure and simplifying the description, and not indicating or implying the device or element indicated must have a specific orientation, be constructed and operate in a specific orientation, and therefore which are not to be construed as limitations of the present disclosure.

In addition, the terms "first" and "second" are used for descriptive purposes only and cannot be understood as indicating or implying relative importance or implicitly indicating the quantity of indicated technical features. Therefore, features defined by "first" or "second" may explicitly or implicitly include at least one of these features. In the description of the present disclosure, "plurality" means at least two, such as two, three, etc., unless otherwise expressly and specifically limited.

In the present disclosure, unless otherwise clearly defined and limited, the terms "mounting", "coupling", "connection", "fixation" and others should be understood in a broad sense, for example, which can be a fixed connection or a detachable connection, or integrally formed; or can be a mechanical connection or an electrical connection; or can be a direct connection or an indirect connection through an intermediate medium; or can be an internal connection between two elements or an interaction between two elements, unless otherwise specified defined. For those of ordinary skill in the art, the specific meanings of the above terms in the present disclosure can be understood according to specific circumstances.

In the present disclosure, unless otherwise expressly stated and limited, a first feature being "on" or "below" a second feature may mean that the first feature is in direct contact with the second feature, or the first feature is in undirect contact with the second feature through an intermediate medium. Furthermore, a first feature being "over", "above" and "on" a second feature may mean that the first feature is directly above or diagonally above the second feature, or simply means that the first feature is higher in level than the second feature. A first feature being "below", "under" and "beneath" a second feature may mean that the first feature is directly below or diagonally below the second feature, or simply means that the first feature is lower in level than the second feature.

It should be noted that when an element is referred to as being "fixed to" or "disposed on" another element, it can be directly on the other element or an intermediate element may also be present. When an element is referred to as being "connected" to another element, it can be directly connected to the other element or there may also be an intermediate element. The terms "vertical", "horizontal", "upper", "lower", "left", "right" and similar expressions used herein are for illustrative purposes only and do not represent the unique implementations.

A heterojunction cell and a manufacturing method thereof, a photovoltaic module and a photovoltaic system according to embodiments of the present disclosure will be described below with reference to the accompanying drawings.

Figure 2:
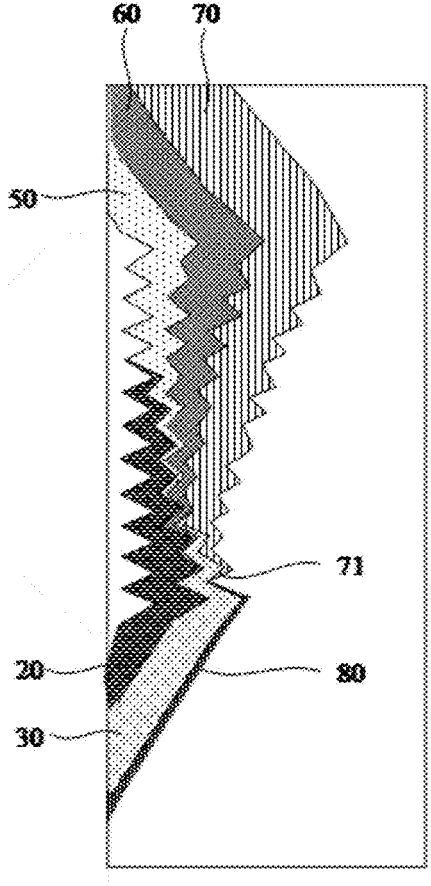
FIG. 2 is a schematic view of a structure of layers on a lateral surface of a heterojunction cell according to an embodiment of the present disclosure.

FIG. 1 is a schematic view of a heterojunction cell according to an embodiment of the present disclosure, and FIG. 2 is a schematic view of a structure of layers on a lateral surface of a heterojunction cell according to an embodiment of the present disclosure.

It should be noted that in the figures of the present disclosure, only a structure of one corner is shown in the longitudinal cross-sectional view taken along a thickness direction of a heterojunction cell 100, however other parts of the heterojunction cell 100 not shown in the cross-sectional view can be similar to these parts shown, thus they will not be repeatedly described herein. In addition, in these figures, a schematic view of a structure of layers on only one lateral surface of the heterojunction cell 100 is provided, however the structures on other lateral surfaces of the heterojunction cell 100 can be the same with the structure of layers shown, thus they will not be repeatedly described herein.

Referring to FIGS. 1 and 2, a first aspect of the embodiments of the present disclosure provides a heterojunction cell 100, including a substrate 10, a first intrinsic silicon layer 20, a first doped layer 30, a first transparent conductive layer 40, a second intrinsic silicon layer 50, a second doped layer 60, and a second transparent conductive layer 70.

The substrate 10 includes a first surface F, a second surface S opposite the first surface F, and a plurality of lateral surfaces C adjacent to and located between the first surface F and the second surface S. The first intrinsic silicon layer 20, the first doped layer 30, and the first transparent conductive layer 40 are sequentially stacked on the first surface F. The second intrinsic silicon layer 50, the second doped layer 60, and the second transparent conductive layer 70 are sequentially stacked on the second surface S. A doping type of the first doped layer 30 is opposite to a doping type of the second doped layer 60.

The first transparent conductive layer 40 covers at least part of the first surface F. The second transparent conductive layer 70 covers the second surface S and at least part of the plurality of lateral surfaces C. An edge 41 of the first transparent conductive layer is spaced apart from an edge 71 of the second transparent conductive layer 71, such that an isolation region 81 is defined between the edge 41 of the first transparent conductive layer and the edge 71 of the second transparent conductive layer.

The edge 41 of the first transparent conductive layer is spaced apart from the edge 71 of the second transparent conductive layer, so as to define an isolation region 81 between the edge 41 of the first transparent conductive layer and the edge 71 of the second transparent conductive layer. As such, the first transparent conductive layer 40 can be effectively isolated from the second transparent conductive layer 70, contact and thus short circuit between the first transparent conductive layer 40 and the second transparent conductive layer 70 can be avoided, thereby reducing efficiency loss. In addition, the second transparent conductive layer 70 covering at least part of the lateral surfaces C can ensure high current density and minimize the loss of fill factor, thereby further improving the efficiency of the heterojunction cell 100.

The first transparent conductive layer 40 covering at least part of the first surface F means that the first transparent conductive layer 40 covers a partial area of the first surface F, or the first transparent conductive layer 40 covers the entire area of the first surface F.

The isolation region 81 herein means a region through which the edge 41 of the first transparent conductive layer is electrically isolated from the edge 71 of the second transparent conductive layer. In addition, in the embodiments of the present disclosure, one covering the other one means that the arranging range of the one is large enough to cover the arranging range of the other one, but does not constitute a limitation on whether the two are in direct contact with each other. For example, the first transparent conductive layer 40 covering the entire area of the first surface F means that a projection of the first transparent conductive layer 40 on the first surface F can completely cover the first surface F, so that the arranging range of the first transparent conductive layer 40 is larger than the arranging range of the first surface F, but it does not constitute a limitation on whether the first transparent conductive layer 40 and the first surface F are in direct contact with each other.

In an embodiment of the present disclosure, the first intrinsic silicon layer 20 and the second intrinsic silicon layer 50 are in an amorphous or microcrystalline state, mainly in amorphous state, and each includes oxygen, carbon, nitrogen and other elements. The first intrinsic silicon layer 20 and the second intrinsic silicon layer 50 may both be intrinsic amorphous silicon, for example.

The first doped layer 30 or the second doped layer 60 is N-type or P-type doped, including oxygen, carbon, nitrogen and other elements. The doping type of one of the first doped layer 30 and the second doped layer 60 is N-typed doped, and the doping type of the other of the first doped layer 30 and the second doped layer 60 is P-type doped. In addition, the first doped layer 30 and the second doped layer 60 are in an amorphous or microcrystalline state, mainly in microcrystalline state. For example, one of the first doped layer 30 and the second doped layer 60 is P-type doped microcrystalline silicon, and the other of the first doped layer 30 and the second doped layer 60 is N-type doped microcrystalline silicon.

Figure 3:
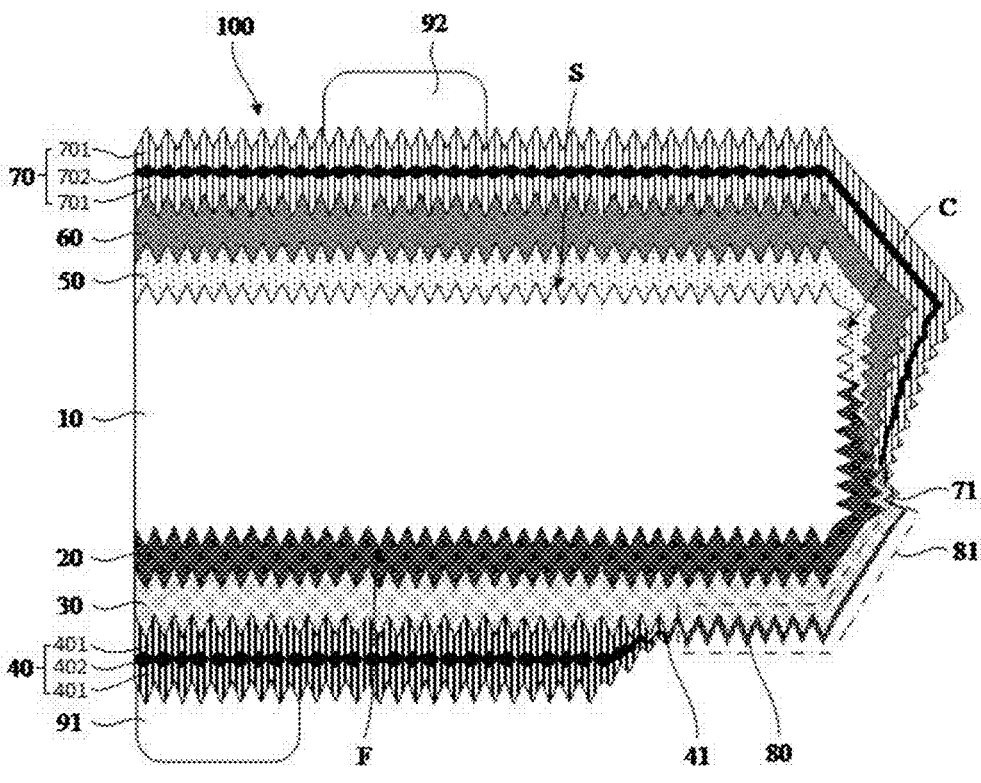
FIG. 3 is a schematic view of a heterojunction cell according to another embodiment of the present disclosure.

At least one of the first transparent conductive layer 40 and the second transparent conductive layer 70 includes one or more silver nanowire layers, and at least two transparent conductive film layers stacked with each other. The transparent conductive film layers are made of different or the same materials. At least two of the transparent conductive film layers is sandwiched with one of the silver nanowire layers. It can be that between every two adjacent transparent conductive film layers is arranged with a silver nanowire layer, or that between only some of the transparent conductive film layers is arranged with a silver nanowire layer. As an example, as shown in FIG. 3, the first transparent conductive layer 40 is formed as including two transparent conductive film layers 401 sandwiched with one silver nanowire layer 402, and the second transparent conductive layer 70 is formed as including two transparent conductive film layers 701 sandwiched with one silver nanowire layer 702. However, various other examples in which only one or both of the first transparent conductive layer 40 and the second transparent conductive layer 70, are formed as including more transparent conductive film layers, and where all or part of the adjacent transparent conductive film layers are sandwiched with a silver nanowire layer, etc., are also envisaged. Herein, through the arrangement of silver nanowires, the thickness of the transparent conductive film layers can be reduced while ensuring the conductivity, so that the thicknesses of the first transparent conductive layer 40 and the second transparent conductive layer 70 are reduced, thereby reducing the amount of usage of transparent conductive oxide (TCO) in the transparent conductive film layers.

Figure 4:
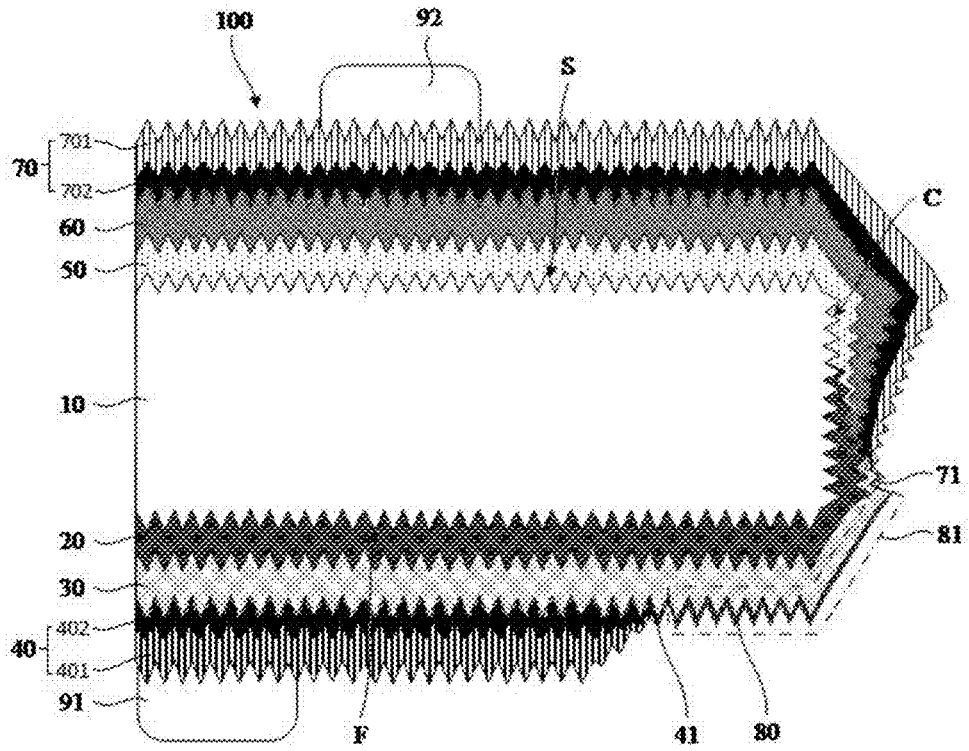
FIG. 4 is a schematic view of a heterojunction cell according to yet another embodiment of the present disclosure.

In some other embodiments, it is also possible that at least one of the first transparent conductive layer 40 and the second transparent conductive layer 70 includes a transparent conductive film layer and a silver nanowire layer arranged on a surface of the transparent conductive film layer that facing the substrate 10. As an example, as shown in FIG. 4, the first transparent conductive layer 40 is formed as including one transparent conductive film layer 401 and one silver nanowire layer 402 arranged on a surface of the transparent conductive film layer 401 that facing the substrate 10, and the second transparent conductive layer 70 is formed as including one transparent conductive film layer 701 and one silver nanowire layer 702 arranged on a surface of the transparent conductive film layer 701 that facing the substrate 10. However, other examples in which only one of the first transparent conductive layer 40 and the second transparent conductive layer 70 is formed as including a transparent conductive film layer and a silver nanowire layer arranged on a surface of the transparent conductive film layer that facing the substrate 10 are also envisaged. Through such arrangement, the thicknesses of the first transparent conductive layer 40 and the second transparent conductive layer 70 can also be reduced.

Herein, the transparent conductive film layer may be made of, for example, indium tin oxide (ITO), indium tungsten oxide (IWO), indium cadmium oxide (ICO), aluminum zinc oxide (AZO), etc.

In an embodiment of the present disclosure, the heterojunction cell 100 further includes one or more dielectric layers. As shown in FIG. 1, at least one dielectric layer 410 is arranged on a surface of the first transparent conductive layer 40 that is away from the substrate 10.

Furthermore, as shown in FIG. 1, at least one dielectric layer 710 is arranged on a surface of the second transparent conductive layer 70 that is away from the substrate 10. Herein, the dielectric layer may include at least one of an anti-reflection layer and a passivation layer. The dielectric layer may be made of materials including at least one of $SiO_2$, SiNx, and SiON.

In an embodiment of the present disclosure, continuing to refer to FIG. 1, the heterojunction cell 100 may further include a first electrode 91 and a second electrode 92. The first electrode 91 is arranged on the first transparent conductive layer 40, and the second electrode 92 is arranged on the second transparent conductive layer 70. In a specific arrangement, a projection of the first electrode 91 on a first plane and a projection of the second electrode 92 on the first plane can be staggered from each other, and the first plane is perpendicular to the thickness direction of the substrate 10. In this way, metal grid lines in the electrodes on both sides of the heterojunction cell 100 are not aligned with each other. In this way, the first electrode 91 located on a side (back side) of the first surface F can reflect the light incident on the first electrode 91 and the first transparent conductive layer 40, thereby increasing the current density of the heterojunction cell 100.

In an embodiment of the present disclosure, in terms of the arrangement of each layer, referring to FIGS. 1 and 2, the second doped layer 60 covers the second intrinsic silicon layer 50, and the second transparent conductive layer 70 covers the second doped layer 60. That is, the arranging range of the second intrinsic silicon layer 50 is smaller than the arranging range of the second doped layer 60, and cannot extend beyond the coverage range of the second doped layer 60. The arranging range of the second doped layer 60 is smaller than the arranging range of the second transparent conductive layer 70, and cannot extend beyond the coverage range of the second transparent conductive layer 70. The arranging range of the first intrinsic silicon layer 20 may be larger than the arranging range of the first doped layer 30, and may extend beyond the coverage range of the first doped layer 30.

The first intrinsic silicon layer 20 and the first doped layer 30 may overlap the second intrinsic silicon layer 50 and the second doped layer 60 on the lateral surfaces C of the substrate 10, or may not be in contact with and be spaced apart from the second intrinsic silicon layer 50 and the second doped layer 60. Herein, descriptions will be given with an example in which the first intrinsic silicon layer 20 and the first doped layer 30 may partially overlap the second intrinsic silicon layer 50 and the second doped layer 60 on the lateral surfaces C of the substrate 10.

In an embodiment of the present disclosure, the first doped layer 30 covers the first surface F and at least part of the plurality of lateral surfaces C, alternatively, the first doped layer 30 can also be arranged only on the side of the first surface F without extending to the lateral surfaces C.

In the case where the first doped layer 30 covers the first surface F and at least part of the plurality of lateral surfaces C, both the second intrinsic silicon layer 50 and the second doped layer 60 cover the second surface S and at least part of the plurality of lateral surfaces C. The first intrinsic silicon layer 20 covers the first surface F and at least part of the plurality of lateral surfaces C. Part of the second intrinsic silicon layer 50 is stacked onto a side of the first intrinsic silicon layer 20 that is away from the substrate 10. Part of the second doped layer 60 is stacked onto a side of the first intrinsic silicon layer 20 that is away from the substrate 10. Part of the first doped layer 30 is stacked onto a side of the second doped layer 60 that is away from the substrate 10. With such arrangements, the current density can be increased and the loss of fill factor can be minimized, thereby further improving the efficiency of the heterojunction cell 100. Certainly, the stacking relationship between the first intrinsic silicon layer 20 and the first doped layer 30, and the second intrinsic silicon layer 50 and the second doped layer 60 is not limited to this, and can also be arranged in other ways, which mainly relates to the formation order of these layers. Part of a latter-formed layer in the preparation process is stacked onto an adjacent former-formed layer in the preparation process.

In an embodiment of the present disclosure, the first transparent conductive layer 40 may be arranged only on the side of the first surface F, that is, the first transparent conductive layer 40 does not extend to the lateral surfaces C. In order to ensure to be isolated from the second transparent conductive layer 70 as much as possible, the first transparent conductive layer 40 may only cover part of the first surface F. For example, the edge 41 of the first transparent conductive layer may be located at the inner side of an outer boundary of the first surface F. The present disclosure contains this example, but is not limited to this. In other embodiments, the arranging range of the first transparent conductive layer 40 may also extend to the lateral surfaces C of the substrate 10.

Figure 5:
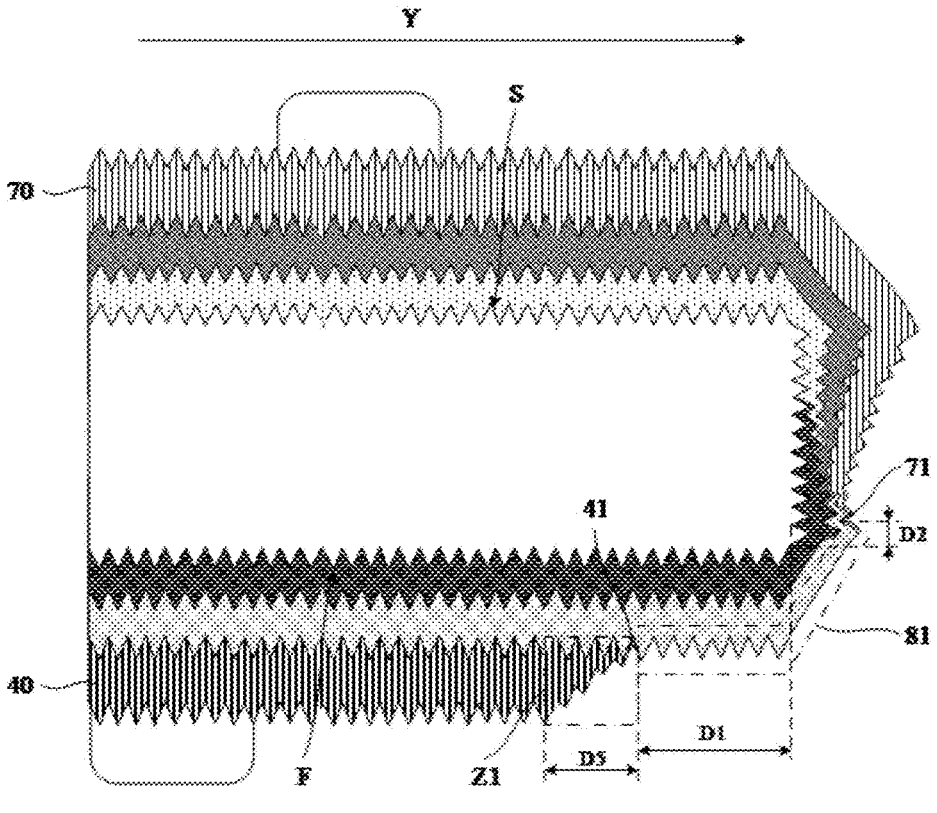
FIG. 5 is a schematic view of a heterojunction cell according to yet another embodiment of the present disclosure.
Figure 6:
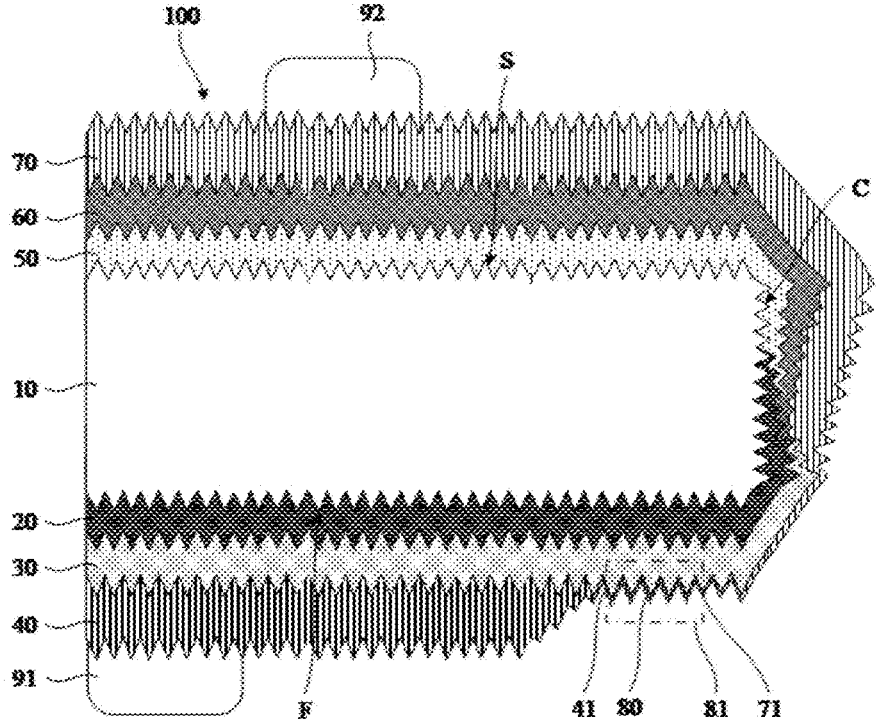
FIG. 6 is a schematic view of a heterojunction cell according to yet another embodiment of the present disclosure.
Figure 7:
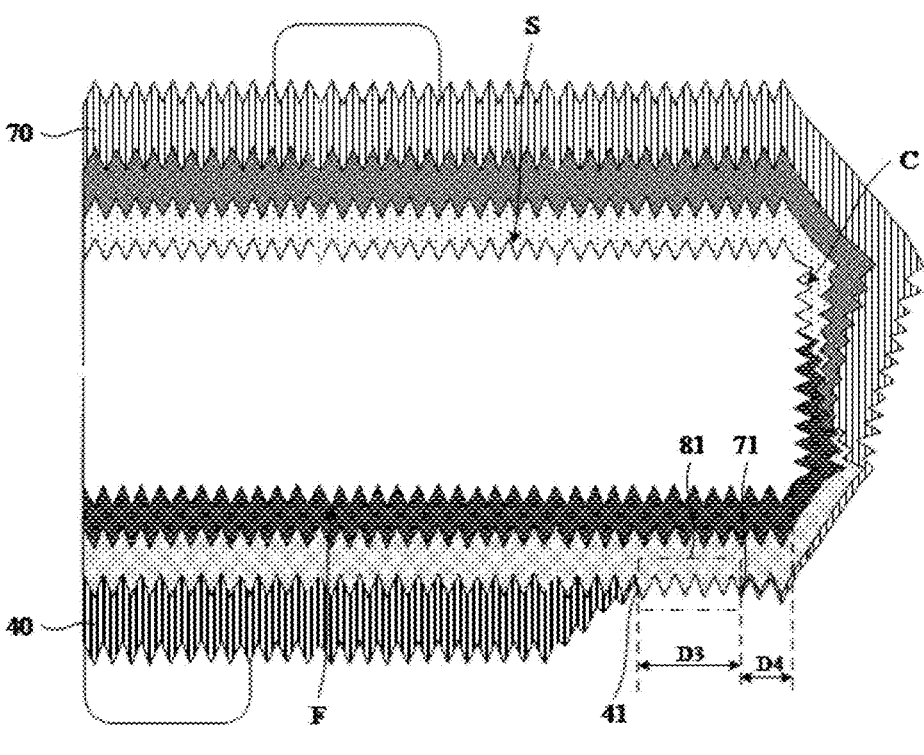
FIG. 7 is a schematic view of a heterojunction cell according to yet another embodiment of the present disclosure.

FIG. 5 is a schematic view of a heterojunction cell 100 according to yet another embodiment of the present disclosure. FIG. 6 is a schematic view of a heterojunction cell 100 according to yet another embodiment of the present disclosure. FIG. 7 is a schematic view of a heterojunction cell 100 according to yet another embodiment of the present disclosure.

Referring to FIG. 5, when the first transparent conductive layer 40 is arranged on the side of the first surface F, the layer thickness of a first region Z1 of the first transparent conductive layer 40 that is adjacent to the edge thereof gradually decreases in a first direction Y. The first direction Y is from the center of the first transparent conductive layer 40 towards the edge 41 of the first transparent conductive layer and is parallel to the first surface F. Further, the minimum width D5 of the first region Z1 in the first direction Y is 100 μm.

In an embodiment of the present disclosure, the arrangement areas of the second transparent conductive layer 70 may be as shown in FIGS. 1 and 5, and the edge 71 of the second transparent conductive layer is located at the lateral surfaces C. Alternatively, as shown in FIGS. 6 and 7, the second transparent conductive layer 70 completely covers each of the lateral surfaces C, and the second transparent conductive layer 70 further covers part of the first surface F.

Referring to FIGS. 1 and 5, in the case where the edge 71 of the second transparent conductive layer is located at the lateral surfaces C, the minimum distance D1 between the edge 41 of the first transparent conductive layer and the boundary of the first surface F is 100 μm. Since the edge 41 of the first transparent conductive layer may have an irregular shape, the distance between the edge 41 of the first transparent conductive layer and the boundary of the first surface F may refer to any of distances from any point on the edge 41 of the first transparent conductive layer to a corresponding point on the line of the boundary of the first surface F, and among these distances, the minimum distance D1 is 100 μm. In this case, the spacing from the edge 41 of the first transparent conductive layer to the lateral surfaces C of the substrate 10, and thus to the edge 71 of the second transparent conductive layer, is sufficient to be able to effectively isolate the first transparent conductive layer 40 from the second transparent conductive layer 70 to avoid short circuit.

Furthermore, the maximum distance D2 between the edge 71 of the second transparent conductive layer and the first surface F is 100 μm. This allows the second transparent conductive layer 70 to have a sufficiently large coverage area on the lateral surfaces C of the substrate 10, so as to maximize the current density, and minimize the loss of fill factor, thereby improving the efficiency of the heterojunction cell 100.

As shown in FIGS. 6 and 7, in the case where the second transparent conductive layer 70 completely covers each of the lateral surfaces C, and the second transparent conductive layer 70 further covers part of the first surface F, the edge 71 of the second transparent conductive layer is located at the outer side of the edge 41 of the first transparent conductive layer.

Further, the minimum distance D3 between the edge 41 of the first transparent conductive layer and the edge 71 of the second transparent conductive layer is 50 μm. With such configuration, when the edge 41 of the first transparent conductive layer and the edge 71 of the second transparent conductive layer are both located on the side of the first surface F, a spacing from the edge 41 of the first transparent conductive layer to the edge 71 of the second transparent conductive layer is sufficient to be able to effectively isolate the first transparent conductive layer 40 from the second transparent conductive layer 70 to avoid short circuit.

In addition, the maximum distance D4 between the edge 71 of the second transparent conductive layer and the boundary of the first surface F is 1000 μm. Such configuration is to control the arranging range of the second transparent conductive layer 70 on the side of the first surface F. The smaller the distance between the edge 71 of the second transparent conductive layer and the boundary of the first surface F, the better, because the plating of the second transparent conductive layer 70 around the first surface F will reduce the parallel resistance of the cell and thus affect the fill factor of the heterojunction cell 100. Such a situation can be avoided by limiting the maximum distance D4 to 1000 μm.

Further, regardless of whether the edge 71 of the second transparent conductive layer is positioned corresponding to the lateral surfaces C or the first surface F, the edge 71 of the second transparent conductive layer can be stacked onto a side of the first doped layer 30 that is away from the substrate 10.

Figure 8:
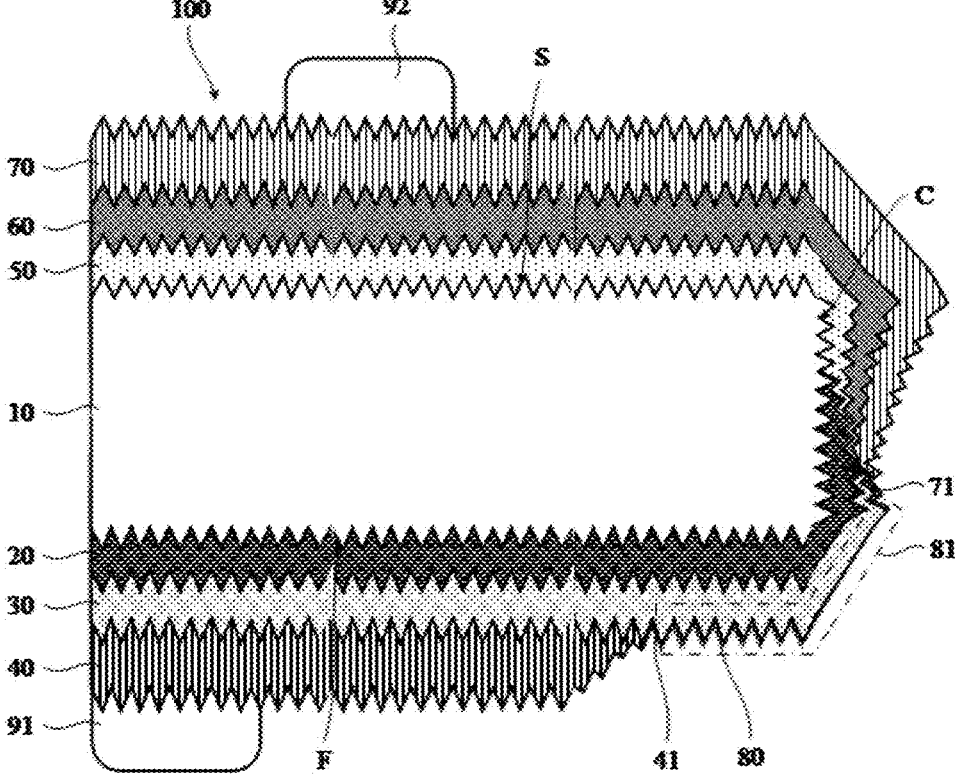
FIG. 8 is a schematic view of a heterojunction cell according to yet another embodiment of the present disclosure.
Figure 9:
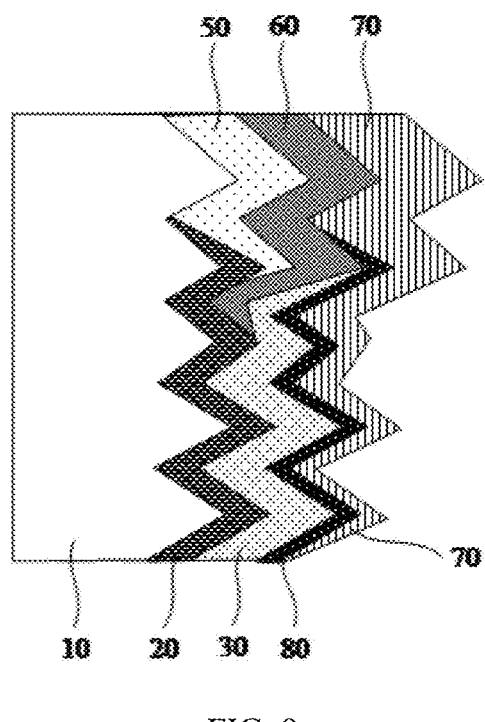
FIG. 9 is a schematic view of a structure of layers on a lateral surface of the heterojunction cell of FIG. 8.
Figure 10:
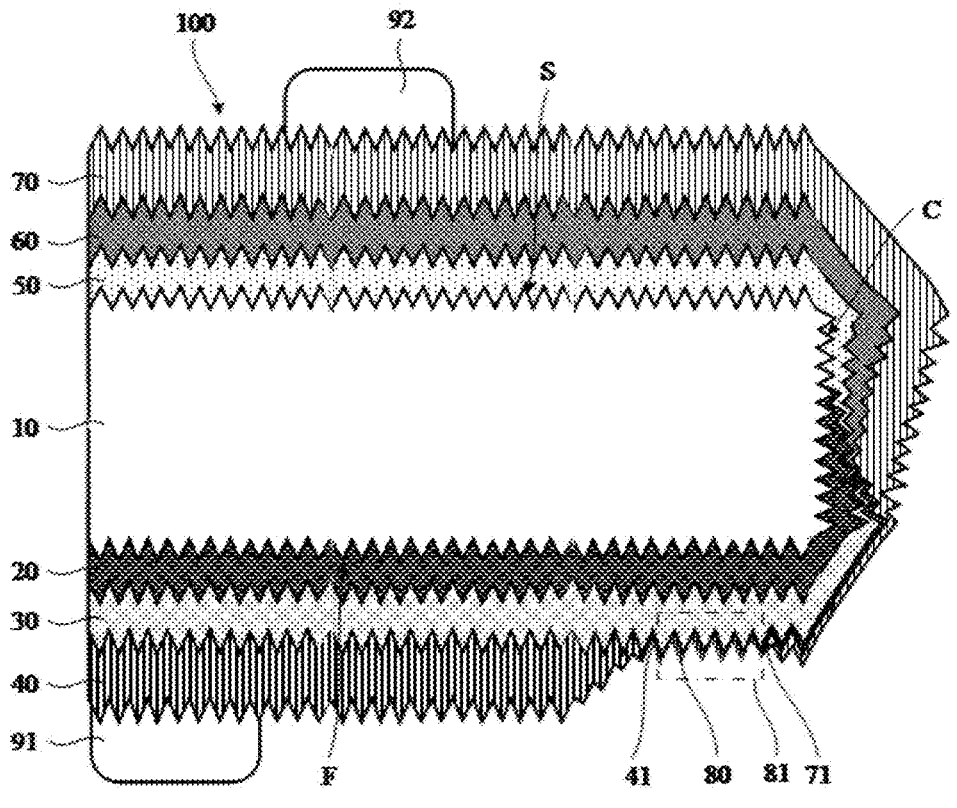
FIG. 10 is a schematic view of a heterojunction cell according to yet another embodiment of the present disclosure.
Figure 11:
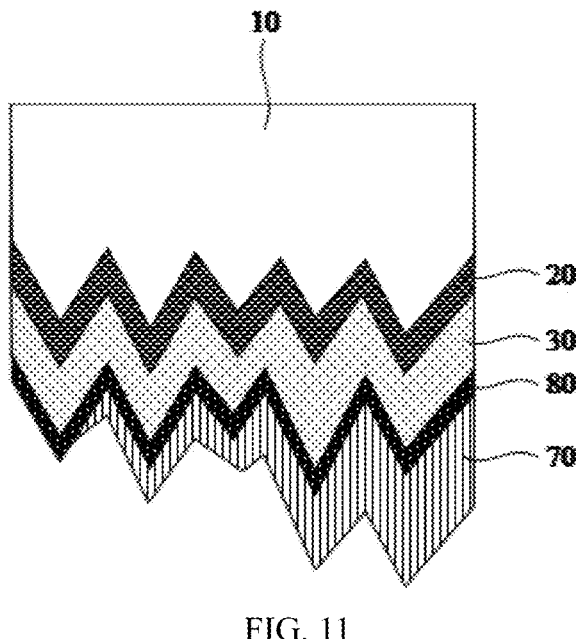
FIG. 11 is a schematic view of a structure of layers at a corner on a side of a first surface of the heterojunction cell of FIG. 10.

FIG. 8 is a schematic view of a heterojunction cell 100 according to yet another embodiment of the present disclosure, FIG. 9 is a schematic view of a structure of layers on lateral surfaces C of the heterojunction cell 100 of FIG. 8, FIG. 10 is a schematic view of a heterojunction cell 100 according to yet another embodiment of the present disclosure, FIG. 11 is a schematic view of a structure of layers near the corner region of the cell on the side of the first surface of the heterojunction cell 100 of FIG. 10.

In an embodiment of the present disclosure, in order to improve the isolation effect of the isolation region 81, it may also be considered to provide an insulating isolation layer 80 at the isolation region 81.

For specific implementation, referring to FIGS. 1, 6, 8 and 10, the heterojunction cell 100 further includes an insulating isolation layer 80. The insulating isolation layer 80 is stacked on the surface of the isolation region 81 and at least covers the isolation region 81. The arrangement of the insulating isolation layer 80 can provide insulation protection for the isolation region 81, thereby further reducing the occurrence of short circuit.

For example, the insulating isolation layer 80 may be made of a material including SiOx, and the insulating isolation layer 80 is further doped with carbon element and nitrogen element.

Further, the insulating isolation layer 80 is further doped with a first doping element. The first doping element is the same as the doping element in the first doped layer 30.

For example, the thickness of the insulating isolation layer 80 is greater than or equal to 1.8 nm. As such, the insulating isolation layer 80 has sufficient thickness to provide insulation protection for the isolation region 81.

In an embodiment of the present disclosure, the arranging range of the insulating isolation layer 80 may cover only the isolation region 81, or may cover a region slightly larger than the isolation region 81.

Referring to FIGS. 1 and 6, as a possible implementation, the insulating isolation layer 80 covers the isolation region 81, and the edge of the insulating isolation layer 80 are adjacent to the edge 41 of the first transparent conductive layer and the edge 71 of the second transparent conductive layer respectively.

Continuing to refer to FIGS. 8, 9, 10 and 11, FIGS. 8 and 9 illustrate the case where the edge 71 of the second transparent conductive layer is located at the lateral surfaces C, and FIGS. 10 and 11 illustrate the case where the edge 71 of the second transparent conductive layer extends to the side of the first surface F. In the above two cases, the insulating isolation layer 80 completely covers the first doped layer 30, such that the insulating isolation layer 80 covers the isolation region 81, and at least part of the insulating isolation layer 80 is isolated between the first doped layer 30 and the second transparent conductive layer 70. With this arrangement, the thickness of the portion of the insulating isolation layer 80 located between the first doped layer 30 and the second transparent conductive layer 70 is relatively thick, making it difficult to occur the tunneling effect of carriers, thereby isolating the first doped layer 30 from the second transparent conductive layer 70. Certainly, in the above two cases, the insulating isolation layer 80 at least completely covers the first doped layer 30 to achieve optimal isolation purposes.

Figure 12:
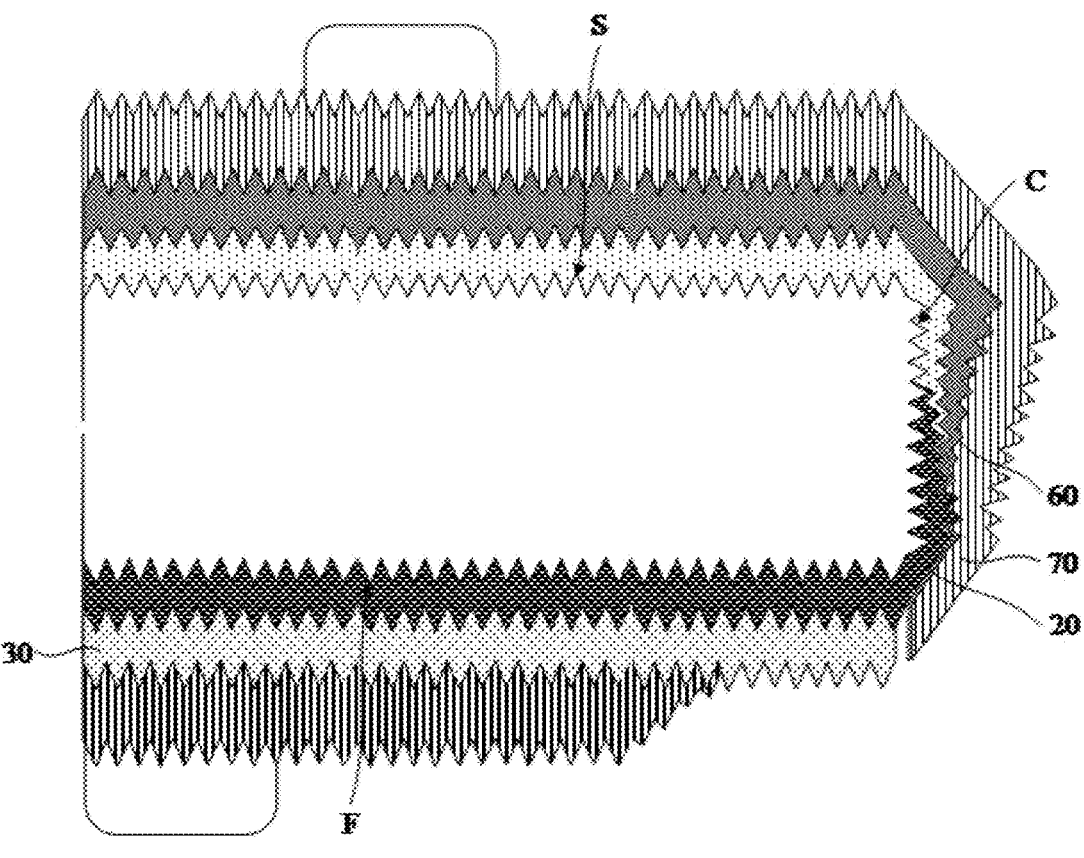
FIG. 12 is a schematic view of a heterojunction cell according to yet another embodiment of the present disclosure.

FIG. 12 is a schematic view of a heterojunction cell 100 according to yet another embodiment of the present disclosure.

In an embodiment of the present disclosure, the first doped layer 30 and the second transparent conductive layer 70 may not be in direct contact with each other. In a specific implementation, referring to FIG. 12, the first doped layer 30 may also be disposed only on the side of the first surface F, and may not extend to the lateral surfaces C. For example, the first doped layer 30 covers the first surface F, and the edge of the second transparent conductive layer 70 is located at each of the lateral surfaces C of the substrate 10. In this way, contact between the second transparent conductive layer 70 and the first doped layer 30 can be avoided as much as possible.

Figure 14:
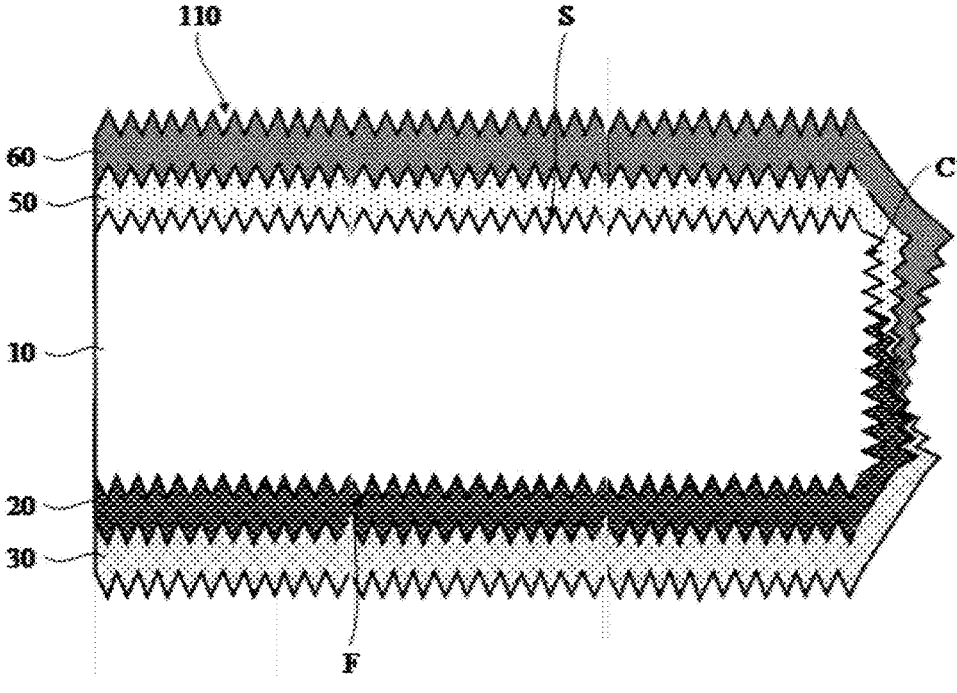
FIG. 14 is a schematic view of a structure of a base plate in the manufacturing method of a heterojunction cell according to an embodiment of the present disclosure.
Figure 15:
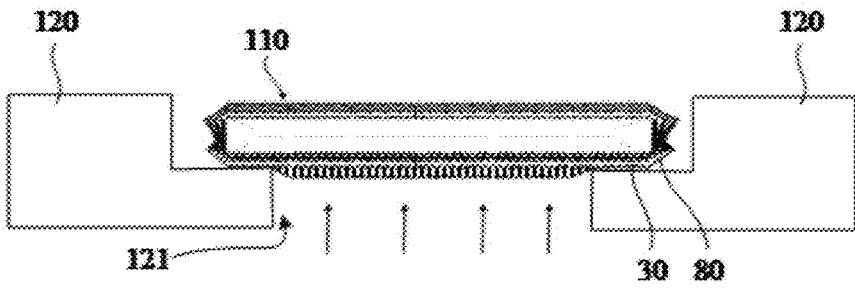
FIG. 15 is a schematic view of forming a first transparent conductive layer and an insulating isolation layer on the base plate in the manufacturing method of a heterojunction cell according to an embodiment of the present disclosure.
Figure 16:
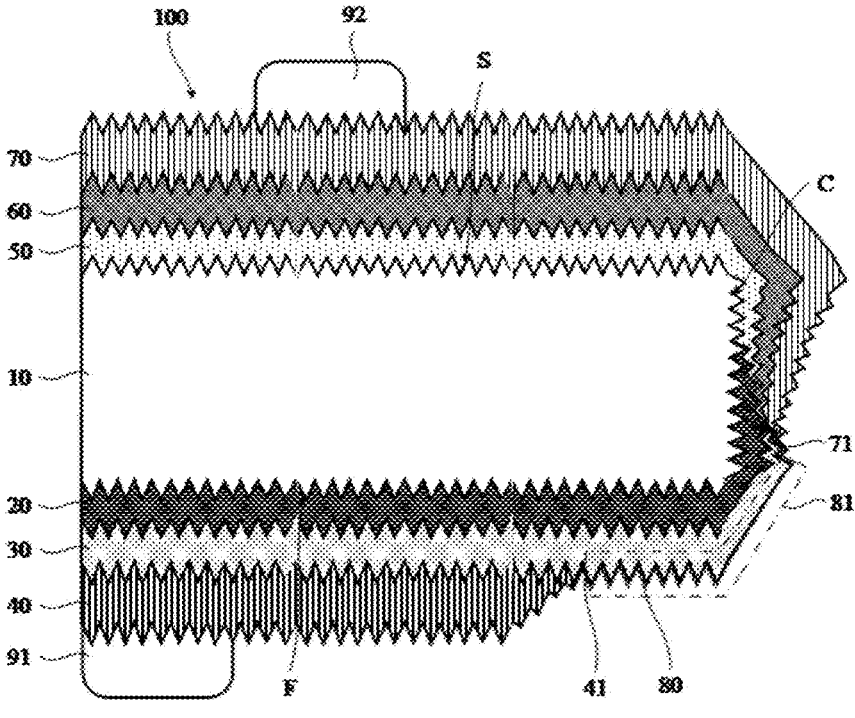
FIG. 16 is a schematic view of a heterojunction cell formed by the manufacturing method of a heterojunction cell according to an embodiment of the present disclosure.

FIG. 13 is a schematic flowchart of a manufacturing method of a heterojunction cell according to an embodiment of the present disclosure, FIG. 14 is a schematic view of a base plate 110 in the manufacturing method of a heterojunction cell according to an embodiment of the present disclosure. FIG. 15 is a schematic view of forming a first transparent conductive layer 40 and an insulating isolation layer 80 on the base plate 110 in the manufacturing method of a heterojunction cell according to an embodiment of the present disclosure. FIG. 16 is a schematic view of a heterojunction cell 100 formed by the manufacturing method of a heterojunction cell according to an embodiment of the present disclosure.

Referring to FIGS. 1, 13, and 14, a second aspect of the embodiments of the present disclosure provides a manufacturing method of a heterojunction cell. The method includes steps of S10 to S30 as follows.

At S10, a base plate 110 is provided. The base plate 110 includes a substrate 10. The substrate 10 includes a first surface F, a second surface S opposite the first surface F, and a plurality of lateral surfaces C adjacent to and located between the first surface F and the second surface S. The base plate 110 further includes: a first intrinsic silicon layer 20 and a first doped layer 30, sequentially stacked on the first surface F; and a second intrinsic silicon layer 50 and a second doped layer 60, sequentially stacked on the second surface S. A doping type of the second doped layer 60 is opposite to a doping type of the first doped layer 30.

At S20, a first transparent conductive layer 40 is formed on the first doped layer 30, such that the first transparent conductive layer 40 covers at least part of the first surface F.

At S30, a second transparent conductive layer 70 is formed on the second doped layer 60, such that the second transparent conductive layer 70 covers the second surface S and at least part of the plurality of lateral surfaces C; and an edge 41 of the first transparent conductive layer is spaced apart from an edge 71 of the second transparent conductive layer, such that an isolation region 81 is defined between the edge 41 of the first transparent conductive layer and the edge 71 of the second transparent conductive layer.

In the embodiment of the present disclosure, the edge 41 of the first transparent conductive layer and the edge 71 of the second transparent conductive layer are spaced apart, so as to define the isolation region 81 between the edge 41 of the first transparent conductive layer and the edge 71 of the second transparent conductive layer. As such, the first transparent conductive layer 40 and the second transparent conductive layer 70 can be effectively isolated from each other, contact and thus short circuit between the first transparent conductive layer 40 and the second transparent conductive layer 70 can be avoided, thereby reducing efficiency loss. In addition, the second transparent conductive layer 70 covering at least part of the lateral surfaces C can ensure high current density and minimize the loss of fill factor, thereby further improving the efficiency of the heterojunction cell 100.

Referring to FIG. 14, in the above step S10, the providing the base plate 110 specifically includes: forming the first intrinsic silicon layer 20 on the first surface F of the substrate 10, such that the first intrinsic silicon layer 20 covers the first surface F and at least part of the plurality of lateral surfaces C; forming the second intrinsic silicon layer 50 on the second surface S of the substrate 10, such that the second intrinsic silicon layer 50 covers the second surface S and at least part of the plurality of lateral surfaces C, and part of the second intrinsic silicon layer 50 is stacked onto the side of the first intrinsic silicon layer 20 that is away from the substrate 10; forming the second doped layer 60 formed on the surface of the second intrinsic silicon layer 50 that is away from the substrate 10, such that the second doped layer 60 covers the second surface S and at least part of the plurality of lateral surfaces C, and part of the second doped layer 60 is stacked onto the side of the first intrinsic silicon layer 20 that is away from the substrate 10; and forming the first doped layer 30 on the surface of the first intrinsic silicon layer 20 that is away from the substrate 10, such that the first doped layer 30 covers the first surface F and at least part of the plurality of lateral surfaces C, and part of the first doped layer 30 is stacked onto the side of the second doped layer 60 that is away from the substrate 10.

In the embodiment of the present disclosure, in steps S20 and S30, the forming the first transparent conductive layer 40 on the first doped layer 30 and the forming the second transparent conductive layer 70 on the second doped layer 60 include: forming the first transparent conductive layer 40 on the first doped layer 30, forming the second transparent conductive layer 70 on the second doped layer 60, and forming an insulating isolation layer 80 on the isolation region 81 such that the insulating isolation layer 80 covers at least the isolation region 81.

The insulating isolation layer 80 herein may be formed simultaneously while forming the first transparent conductive layer 40 and the second transparent conductive layer 70. For example, the insulating isolation layer 80 may be formed during the formation of the first transparent conductive layer 40.

For example, referring to FIGS. 15, 8 and 16, the forming the first transparent conductive layer 40 on the first doped layer 30, the forming the second transparent conductive layer 70 on the second doped layer 60, and the forming the insulating isolation layer 80 on the isolation region 81 include: placing a carrier plate 120 having a hollow 121 in the middle into a reaction chamber (not shown); placing the base plate 110 on the carrier plate 120 such that the first doped layer 30 faces the carrier plate 120, and that a second region of the first doped layer 30 is exposed to the outside through the hollow 121, where the second region refers to a region of the first doped layer 30 corresponding to the hollow 121; the first doped layer 30 further includes a third region, and the third region refers to a portion other than the second region, of the surface of the first doped layer 30 that is away from the substrate 10; forming the first transparent conductive layer 40 in the second region of the first doped layer 30, while forming the insulating isolation layer 80 in the third region of the first doped layer 30; and forming the second transparent conductive layer 70 on the second doped layer 60.

Part of the second transparent conductive layer at the edge 71 thereof can be stacked onto the side of the insulating isolation layer 80 that is away from the substrate 10, so that the portion of the third region that is not covered by the edge 71 of the second transparent conductive layer forms the isolation region 81. In this way, the insulating isolation layer 80 covers the isolation region 81 on the one hand, and on the other hand, the portion of the insulating isolation layer 80 that is located between the second transparent conductive layer 70 and the first doped layer 30 plays an insulating isolation role.

In addition, as previously described in FIG. 5, due to the influence on the edge portion by the hollow 121 of the carrier plate 120, in the first transparent conductive layer 40 formed at this time, the layer thickness of the first region Z1 of the first transparent conductive layer 40 adjacent to the edge thereof gradually decreases in the first direction.

For example, in the forming the first transparent conductive layer 40 in the second region of the first doped layer 30 and the forming the insulating isolation layer 80 in the third region of the first doped layer 30, the water vapor pressure in the reaction chamber is in a range of $3e^{-3}$ Pa to $9.5e^{-3}$ Pa, preferably, in a range of $5e^{-3}$ Pa to $8e^{-3}$ Pa. The temperature of the carrier plate 120 can be set greater than 85° C. The formation of the insulating isolation layer 80 is achieved by controlling the water vapor pressure in the reaction chamber.

The first transparent conductive layer 40 can be formed, for example, by using a physical vapor deposition (PVD) method. The plasma (containing water vapor and oxygen-containing ions) of the target for the first transparent conductive layer 40 passes through the hollow 121 area shown in FIG. 15 and is formed into the first transparent conductive layer 40 on the surface of the second region. At the same time, the free oxygen-containing ions are also formed into the insulating isolation layer 80 on the portion of the first doped layer 30 other than the second region.

Specifically, under the actions of high water vapor pressure, the temperature of the carrier plate 120 being higher than 85° C., and the oxygen-containing plasma, the region of the surface of the first doped layer 30 away from the substrate 10 that is covered by the carrier plate 120, and the portion of this surface other than the second region will be oxidized by free oxygen-containing ions to form the insulating isolation layer 80. The oxygen-containing ions include, for example, $O^-$ ions and $HO^-$ ions. The formed insulating isolation layer 80 is partially located on the side of the first surface F, and partially extends to the side of the lateral surfaces C of the substrate 10.

The second transparent conductive layer 70 is prepared after the insulating isolation layer 80 is formed. Therefore, the insulating isolation layer 80 is isolated between the second transparent conductive layer 70 and the first doped layer 30. The thickness of the insulating isolation layer 80 is greater than or equal to 1.8 nm. The silicon oxide with this thickness can no longer be regarded as a tunneling layer, and has a high resistance, so that the transparent conductive layer 70 and the first doped layer 30 are electrically insulated from each other in an overlapping region between the second transparent conductive layer 70 and the first doped layer 30. The insulating isolation layer 80 is formed on the surface of the first doped layer 30, so the doped element in the insulating isolation layer 80 may be partially the same as the doped element of the first doped layer 30, for example, the element may be boron.

In an embodiment of the present disclosure, in step S30, the method further includes, after forming the second transparent conductive layer 70 on the second doped layer 60: forming a first electrode 91 on the first transparent conductive layer 40; and forming a second electrode 92 on the second transparent conductive layer 70, where a projection of the first electrode 91 on the first plane and the projection of the second electrode 92 on the first plane are staggered from each other, and the first plane is perpendicular to the thickness direction of the substrate 10.

A specific example will be given below in conjunction with FIGS. 14, 15 and 16 to illustrate the manufacturing method of the heterojunction cell of the present disclosure. The manufacturing method includes step 1 to step 5 as follows.

At step 1, the substrate 10 is cleaned through a cleaning and texturizing process, and a pyramid-shaped texturized surface is prepared on the surface of the substrate 10.

At step 2, the first intrinsic silicon layer 20, the second intrinsic silicon layer 50, the second doped layer 60, and the first doped layer 30 are deposited in sequence by using a plasma enhanced chemical vapor deposition (PECVD). Specifically, the first intrinsic silicon layer 20 is formed on the first surface F of the base plate 110. The second intrinsic silicon layer 50 is formed on the second surface S of the base plate 110. The second doped layer 60 is formed on the surface of the second intrinsic silicon layer 50 that is away from the substrate 10. The first doped layer 30 is formed on the surface of the first intrinsic silicon layer 20 that is away from the substrate 10.

At Step 3, the first transparent conductive layer 40, the insulating isolation layer 80 and the second transparent conductive layer 70 are sequentially prepared by using a PVD device or reactive plasma deposition (RPD) device. Specifically, the substrate 10 on which the first doped layer 30 is formed is placed on the carrier plate 120, such that the first doped layer 30 faces the carrier plate 120, and the second region of the first doped layer 30 is exposed to the outside through the hollow 121. The water vapor pressure in the reaction chamber is set to $3e^{-3}$ Pa to $9.5e^{-3}$ Pa. Under the condition that the temperature of the carrier plate 120 is higher than 85° C., while the first transparent conductive layer 40 is formed on the second region of the first doped layer 30, the insulating isolation layer 80 is formed on the remaining region of the first doped layer 30, that is, the third region. Then, the second transparent conductive layer 70 is formed on the second doped layer 60.

At Step 4, a metal paste is printed on the first transparent conductive layer 40 and the second transparent conductive layer 70 by screen printing, and is solidified at a certain temperature to form the first electrode 91 and the second electrode 92 respectively.

Step 5: the heterojunction cell 100 is formed by using a light injection device to perform light injection and annealing.

A third aspect of the present disclosure further provides a photovoltaic module. The photovoltaic module includes at least one cell string. Each cell string includes at least two heterojunction cells 100 as described above.

The heterojunction cells 100 can be connected together through series welding, so that the electric energy generated by a single heterojunction cell 100 is collected for subsequent transmission. In an embodiment, the heterojunction cells 100 can be arranged at intervals or stacked together one on the top of another.

For example, the photovoltaic module further includes an encapsulation layer and a cover plate. The encapsulation layer is used to cover a surface of the at least one cell string. The cover plate is used to cover a surface of the encapsulation layer that is away from the cell string.

A fourth aspect of the present disclosure further provides a photovoltaic system. The photovoltaic system includes the above-mentioned photovoltaic module.

The Photovoltaic system can be applied in photovoltaic power stations, such as ground power stations, rooftop power stations, water surface power stations, etc., or in equipment or devices that use solar energy to generate electricity, such as user solar power supplies, solar street lights, solar cars, solar buildings, etc. Certainly, it is appreciated that the application scenarios of the photovoltaic system are not limited to this, that is, the photovoltaic system can be applied in all fields that require solar energy to generate electricity. Taking the photovoltaic power generation system network as an example, the photovoltaic system can include photovoltaic arrays, combiner boxes and inverters. The photovoltaic array can be an array combination of multiple photovoltaic modules. For example, the multiple photovoltaic modules can form multiple photovoltaic arrays; the photovoltaic arrays are connected to form the combiner boxes; the combiner boxes can combine the current generated by the photovoltaic arrays. The combined current flows through the inverters and is converted into the alternating current required by the mains grid and then connected to the mains network to realize solar power supply.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be subjected to the appended claims.

The invention claimed is:

1. A heterojunction cell, comprising:

a substrate comprising a first surface, a second surface opposite the first surface, and a plurality of lateral surfaces adjacent to and located between the first surface and the second surface;

a first intrinsic silicon layer, a first doped layer, and a first transparent conductive layer that are sequentially stacked on the first surface; and a second intrinsic silicon layer, a second doped layer, and a second transparent conductive layer that are sequentially stacked on the second surface, and wherein a doping type of the first doped layer is opposite to a doping type of the second doped layer; and wherein the first transparent conductive layer covers at least part of the first surface; the second transparent conductive layer covers the second surface and at least part of the plurality of lateral surfaces; an edge of the first transparent conductive layer is spaced apart from an edge of the second transparent conductive layer, such that an isolation region is defined between the edge of the first transparent conductive layer and the edge of the second transparent conductive layer;

wherein the first doped layer covers a part of the plurality of lateral surfaces; part of the second transparent conductive layer is located on a side of the first doped layer that is away from the substrate; and the second transparent conductive layer has a layer region opposite to a layer region of the first doped layer;

wherein the heterojunction cell further comprises an insulating isolation layer that is stacked on a surface of the isolation region and completely covers the isolation region;

wherein a portion of the insulating isolation layer is in direct contact with both the layer region of the second transparent conductive layer and the layer region of the first doped layer that are opposite to each other respectively, and is isolated between the layer region of the second transparent conductive layer and the layer region of the first doped layer that are opposite to each other; and wherein: the second intrinsic silicon layer and the second doped layer both cover the second surface and at least part of the plurality of lateral surfaces; the first intrinsic silicon layer covers the first surface and at least part of the plurality of lateral surfaces; and part of the second intrinsic silicon layer is stacked onto a side of the first intrinsic silicon layer that is away from the substrate, part of the second doped layer is stacked onto the side of the first intrinsic silicon layer that is away from the substrate, and part of the first doped layer is stacked onto a side of the second doped layer that is away from the substrate.

2. The heterojunction cell according to claim 1, wherein the edge of the second transparent conductive layer is located on the lateral surfaces.

3. The heterojunction cell according to claim 1, wherein the second transparent conductive layer completely covers each of the lateral surfaces, and the second transparent conductive layer further covers part of the first surface; and the edge of the second transparent conductive layer is located at an outer side of the edge of the first transparent conductive layer.

4. The heterojunction cell according to claim 1, wherein the edge of the second transparent conductive layer is stacked onto a side of the first doped layer that is away from the substrate.

5. The heterojunction cell according to claim 1, wherein a thickness of the insulating isolation layer is greater than or equal to 1.8 nm.

6. The heterojunction cell according to claim 1, wherein an edge of the insulating isolation layer is adjacent to the edge of the first transparent conductive layer.

7. The heterojunction cell according to claim 1, wherein the insulating isolation layer is made of a material comprising SiOx;
the insulating isolation layer is further doped with carbon element and nitrogen element; and/or
the insulating isolation layer is further doped with a first doping element, and the first doping element is the same as a doping element in the first doped layer.

8. The heterojunction cell according to claim 1, wherein the edge of the second transparent conductive layer is located on each of the lateral surfaces of the substrate.

9. The heterojunction cell according to claim 1, wherein a layer thickness of a first region of the first transparent conductive layer adjacent to the edge thereof gradually decreases in a first direction; wherein the first direction is from a center of the first transparent conductive layer towards the edge of the first transparent conductive layer and is parallel to the first surface.

10. The heterojunction cell according to claim 1, further comprising a first electrode and a second electrode;
wherein the first electrode is arranged on the first transparent conductive layer, and the second electrode is arranged on the second transparent conductive layer; and
a projection of the first electrode on a first plane and a projection of the second electrode on the first plane are staggered from each other, and the first plane is perpendicular to a thickness direction of the substrate.

11. The heterojunction cell according to claim 1, wherein at least one of the first transparent conductive layer and the second transparent conductive layer comprises one or more silver nanowires layers, and at least two transparent conductive film layers stacked with each other; the at least two transparent conductive film layers are made of different materials; and at least two of the transparent conductive film layers is sandwiched with one of the silver nanowires layers; or
wherein at least one of the first transparent conductive layer and the second transparent conductive layer comprises a transparent conductive film layer and a silver nanowire layer arranged on a surface of the transparent conductive film layer that facing the substrate.

12. The heterojunction cell according to claim 11, further comprising one or more dielectric layers;

wherein at least one of the dielectric layers is arranged on a surface of the first transparent conductive layer that is away from the substrate; and/or
at least one of the dielectric layers is arranged on a surface of the second transparent conductive layer that is away from the substrate.

13. A manufacturing method of a heterojunction cell, comprising:
providing a base plate, wherein the base plate comprises a substrate, the substrate comprises a first surface, a second surface opposite the first surface, and a plurality of lateral surfaces adjacent to and located between the first surface and the second surface, wherein the base plate further comprises a first intrinsic silicon layer and a first doped layer sequentially stacked on the first surface, and a second intrinsic silicon layer and a second doped layer sequentially stacked on the second surface, wherein a doping type of the second doped layer is opposite to a doping type of the first doped layer, and wherein the first doped layer covers a part of the plurality of lateral surfaces;
forming a first transparent conductive layer on the first doped layer, wherein the first transparent conductive layer covers at least part of the first surface;
forming a second transparent conductive layer on the second doped layer, wherein the second transparent conductive layer covers the second surface and at least part of the plurality of lateral surfaces, and an edge of the first transparent conductive layer is spaced apart from an edge of the second transparent conductive layer, such that an isolation region is defined between the edge of the first transparent conductive layer and the edge of the second transparent conductive layer, and forming an insulating isolation layer on the isolation region, wherein the insulating isolation layer is stacked on a surface of the isolation region and completely covers the isolation region, wherein part of the second transparent conductive layer is located on a side of the first doped layer that is away from the substrate, and the second transparent conductive layer has a layer region opposite to a layer region of the first doped layer;
wherein a portion of the insulating isolation layer is in direct contact with both the layer region of the second transparent conductive layer and the layer region of the first doped layer that are opposite to each other respectively, and is isolated between the layer region of the second transparent conductive layer and the layer region of the first doped layer that are opposite to each other; and
wherein: the second intrinsic silicon layer and the second doped layer both cover the second surface and at least part of the plurality of lateral surfaces; the first intrinsic silicon layer covers the first surface and at least part of the plurality of lateral surfaces; and part of the second intrinsic silicon layer is stacked onto a side of the first intrinsic silicon layer that is away from the substrate, part of the second doped layer is stacked onto the side of the first intrinsic silicon layer that is away from the substrate, and part of the first doped layer is stacked onto a side of the second doped layer that is away from the substrate.

14. A photovoltaic module, comprising at least one cell string, wherein each cell string comprises at least two heterojunction cells according to claim 1.

15. A photovoltaic system, comprising the photovoltaic module according to claim 14.

16. The heterojunction cell according to claim 1, wherein the insulating isolation layer completely covers the first doped layer in the isolation region.

17. The heterojunction cell according to claim 1, wherein the isolation region is neither covered by the first transparent conductive layer nor covered by the second transparent conductive layer, such that the first transparent conductive layer and the second transparent conductive layer are spaced apart from each other by the isolation region and do not overlap with each other; and wherein the layer region of the first doped layer is not covered by the first transparent conductive layer.

\* \* \* \* \*